United States Patent
Zhou et al.

(10) Patent No.: US 10,392,520 B2
(45) Date of Patent: Aug. 27, 2019

(54) CARBON NANOTUBE COMPOSITE FILM AND METHOD FOR PRODUCING SAID COMPOSITE FILM

(71) Applicant: NATIONAL INSTITUTE OF ADVANCED INDUSTRIAL SCIENCE AND TECHNOLOGY, Chiyoda-ku, Tokyo (JP)

(72) Inventors: Ying Zhou, Tsukuba (JP); Reiko Azumi, Tsukuba (JP); Satoru Shimada, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/519,512

(22) PCT Filed: Oct. 16, 2015

(86) PCT No.: PCT/JP2015/079263
§ 371 (c)(1),
(2) Date: Apr. 14, 2017

(87) PCT Pub. No.: WO2016/060225
PCT Pub. Date: Apr. 21, 2016

(65) Prior Publication Data
US 2017/0226353 A1    Aug. 10, 2017

(30) Foreign Application Priority Data

Oct. 17, 2014 (JP) .................. 2014-212191

(51) Int. Cl.
*H01B 1/04* (2006.01)
*C09D 5/24* (2006.01)
(Continued)

(52) U.S. Cl.
CPC .............. *C09D 5/24* (2013.01); *C01B 32/158* (2017.08); *C09D 11/037* (2013.01); *C09D 11/32* (2013.01);
(Continued)

(58) Field of Classification Search
CPC .................................. H01B 1/06; H01B 1/04
See application file for complete search history.

(56) References Cited

U.S. PATENT DOCUMENTS 9,214,256 B2 * 12/2015 Sivarajan ................ H01B 1/18
2010/0044074 A1    2/2010 Kim et al.
(Continued)

FOREIGN PATENT DOCUMENTS

JP    2006-190815 A    7/2006
JP    2008-103329 A    5/2008
(Continued)

OTHER PUBLICATIONS

PCT International Search Report and Written Opinion, International Application No. PCT/JP2015/079263, dated Dec. 8, 2015, 9 Pages. (with English translation of International Search Report).
(Continued)

*Primary Examiner* — William D Young
(74) *Attorney, Agent, or Firm* — Fenwick & West LLP (57) ABSTRACT

Provided is a carbon nanotube (CNT) network which can improve an electrical joint so that a sufficient amount of current flows into a thin film and the amount of current is controlled. A network of CNT or a CNT hybrid material is constructed by distributing, as a node between CNT and CNT in a CNT thin film, a fine particle of an inorganic semiconductor and preferably fine particles of a metal halide, a metal oxide, or a metal sulfide.

2 Claims, 6 Drawing Sheets

(51) Int. Cl.
  *C09D 11/037* (2014.01)
  *C09D 11/32* (2014.01)
  *C09D 11/52* (2014.01)
  *H01L 29/41* (2006.01)
  *C01B 32/158* (2017.01)
  *B82Y 30/00* (2011.01)
  *B82Y 40/00* (2011.01)

(52) U.S. Cl.
  CPC ............... *C09D 11/52* (2013.01); *H01B 1/04* (2013.01); *H01L 29/413* (2013.01); *B82Y 30/00* (2013.01); *B82Y 40/00* (2013.01); *Y10S 977/75* (2013.01); *Y10S 977/842* (2013.01); *Y10S 977/892* (2013.01); *Y10S 977/932* (2013.01)

(56) References Cited

U.S. PATENT DOCUMENTS

2013/0000952 A1* 1/2013 Srinivas ............... H01B 1/02
  174/126.1
2013/0264116 A1* 10/2013 Lashmore ............. B05D 5/12
  174/94 R
2013/0269770 A1 10/2013 Miller

FOREIGN PATENT DOCUMENTS

| JP | 2011-517501 A | 6/2011 |
|---|---|---|
| JP | 2013-095867 A | 5/2013 |
| WO | WO 2009/154830 A2 | 12/2009 |
| WO | WO-2013/155111 A1 | 10/2013 |
| WO | WO-2014/021344 A1 | 2/2014 |

OTHER PUBLICATIONS

Kim, Y., et al., "Industrially Feasible Approach to Transparent, Flexible, and Conductive Carbon Nanotube Films: Cellulose-Assisted Film Deposition Followed by Solution and Photonic Processing," Applied Physics Express, 2013, vol. 6, No. 2, 025101 (4 pages).

Tian, X., et al., "Effect of Atomic Interconnects on Percolation in Single-Walled Carbon Nanotube Thin Film Networks," Nano letters, 2014, pp. 3930-3937, vol. 14, No. 7.

Velamakanni, A., et al., "Site-Specific Deposition of Au Nanoparticles in CNT Films by Chemical Bonding," ACS nano, 2010, pp. 540-546, vol. 4. No. 1.

European Extended Search Report, European Application No. 15851240.0, dated Feb. 13, 2018, 10 pages.

Arai, S. et al., "Electroless Deposition of Silver on Multiwalled Carbon Nanotubes Using Iodide Bath," Journal of the Electrochemical Society, 2011, pp. D506-D510, vol. 158, No. 8.

Martis, P. et al., "Infrared Irradiation Controlled Decoration of Multiwalled Carbon Nanotubes with Copper/Copper Oxide Nanocrystals," Acta Materialia, Apr. 28, 2011, pp. 5040-5047, vol. 59, No. 12.

* cited by examiner

CARBON NANOTUBE COMPOSITE FILM AND METHOD FOR PRODUCING SAID COMPOSITE FILM

TECHNICAL FIELD

The present invention relates to a carbon nanotube composite film and a method of producing the composite film.

BACKGROUND ART

A transparent conductive film is a transparent film through which a current can flow. The current main stream of the transparent conductive film is indium tin oxide (ITO). The ITO film exhibits excellent property, for example, a transmittance of 90% and a sheet resistance of approximately 10 $\Omega$/square (also written as $\Omega$/□), but the ITO film has problems of poor flexibility and resource depletion because indium is a rare metal. In addition, since the ITO film is produced by a vacuum deposition process, the cost is high.

Therefore, new electrode materials replacing ITO have been required. As such alternative materials, carbon nanotubes (hereinafter, referred to as "CNT"), metal nanowires, or conductive polymers are exemplified. Among these, CNT, which has an excellent electrical property and machine property, is expected as the most desirable material replacing ITO.

CNT has been attracting attention as a new material that exhibits various new functions, and active research and development are performed all over the world. In order to effectively use CNT, including the above-described transparent conductive film, for various industrial applications in the future, it is necessary to disperse multiple CNTs, instead of using one CNT alone, onto a substrate to form a thin film in which a network of CNTs is built.

Usually, when a dispersion solution of CNTs is dropped onto a substrate and is then dried, a CNTs network is built in a portion onto which the solution has been dropped, and then a CNT thin film is formed. However, the CNTs thin film exhibits properties different from a single CNT. For example, the conductivity of the CNTs thin film is significantly inferior to that of the single CNT. The reason for this is considered that electrical conduction between CNT and CNT greatly affects the conductivity of the CNTs thin film.

Accordingly, it is necessary to physically improve an electrical joint between CNT and CNT to build a high-quality CNTs network. For this, it is effective to prepare a node in a joint region.

In response to this, there is a known method in which, after forming a carboxylic acid group on the surface of the CNTs, a network structure of the CNTs is prepared using isocyanate as the node (Patent Document 1). Disadvantageously, in this method, an excellent electrical property of the CNT is degraded due to the formation of the carboxylic acid group on the surface of the CNTs, and an excellent electrical joint between CNTs is not formed because the isocyanate, which is a non-conductive material, is used for the joint.

There is a known method of preparing a CNTs network using a silica particle, by means of using a so-called alternate adsorption method of repeating a step of adsorbing a silica particle onto a substrate, electrostatically adsorbing the CNT thereonto, and further adsorbing a silica particle thereonto (Patent Document 2). Disadvantageously, an excellent electrical joint between the CNTs is not formed because the silica particle, which is a non-conductive material, is used for the joint.

It is suggested that the conductivity of the CNTs thin film be improved by preparing a dispersion liquid of conductive inorganic nanoparticles formed of a metal oxide and a CNTs dispersion liquid and alternately exposing these two dispersion liquids onto a substrate to distribute the inorganic nanoparticles throughout the CNTs network (Patent Document 3).

Disadvantageously, the conductivity of the CNTs network is not effectively affected because only an inorganic nanoparticle unintentionally disposed on a joint portion of CNTs affects the conductivity of the CNTs network, and the inorganic nanoparticle present on the surface of the CNTs do not contribute to the conductivity of the CNTs network. In fact, in example of this document, the sheet resistance of the prepared thin film is in a range of 1000 to 1500 $\Omega$/square. It cannot be said that a film having a sheet resistance value in this range is enough to be used as a transparent conductive film.

It is suggested that the conductivity of the CNTs thin film be improved by bridging a metal disposed on a joint portion of the CNT in the CNT thin film (Patent Document 4 and Non-Patent Documents 1 and 2).

Disadvantageously, the transmittance of the film is decreased as the content of the metal particles is increased when the CNT transparent conductive film is prepared using the metal particles since the metal particles usually absorb visible light. Moreover, in order to bridge the metal disposed on the joint portion of CNT, the method described in Patent Document 4 is a complicated method in which a liquid containing metal ions is sprayed to the CNTs thin film and the current is flown in the CNTs thin film to conduct electrolytic plating of the metal to the joint portion of the CNTs, thereby depositing the metal. In order to flow the current, the CNTs network needs to be in contact with a metal electrode. Accordingly, this method is not practically used as a method of preparing a transparent conductive film that needs to be formed in a large area.

In regard to a transparent conductive film using CNTs, a method of preparing a uniform CNTs thin film and a post-treatment method for exhibiting conductivity are suggested by the present inventors (Patent Document 5 and Non-Patent Document 3). Disadvantageously, as a method of improving the conductivity of the CNTs thin film, a method of doping nitric acid, which is typically known, is used in place of a method of controlling a node of the CNTs network. Accordingly, it is difficult to stably maintain the conductivity for a long period of time.

As a dopant adhering to the outer circumferential surface of the CNT for the purpose of improving the electrical physical properties of the CNT, there is a suggestion of a donor having an ionization potential of 5.8 eV or less in a vacuum or a dopant material on which an acceptor having an electron affinity of 2.7 eV or greater in a vacuum is deposited (Patent Document 6).

Disadvantageously, since a principal of performing p type doping or n type doping is used for improving the conductivity of the CNTs thin film, the suggested dopant material cannot be used for a process of preparing a transparent conductive film in a mild environment, such as in the air, because the dopant material is extremely easily oxidized or easily reduced.

There is a suggestion of a method in which a conductive polymer such as polythiophene is used, as a dispersant, to the CNTs transparent conductive film, and Lewis acid, protonic acid, a transition metal halide, a noble metal halide, and an organic metal are doped as the p type dopant of the conductive polymer, or an alkali metal or an alkyl aluminum ion are doped as the n type dopant thereof (Patent Document 7). Disadvantageously, since the carrier mobility of a conductive polymer is inferior to the carrier mobility inherent in the CNT, a low sheet resistance is difficult to obtain even when the p type or n type doping is performed on the conductive polymer dispersant. Moreover, disadvantageously, since the doped conductive polymer strongly absorbs visible light, the absorption of the conductive polymer dispersant is a bottleneck to using as a transparent conductive film.

RELATED DOCUMENT

Patent Document

[Patent Document 1] Japanese Unexamined Patent Publication No. 2013-95867
[Patent Document 2] United States Unexamined Patent Publication No. 2013/0269770
[Patent Document 3] Japanese Unexamined Patent Publication No. 2011-517501
[Patent Document 4] United States Unexamined Patent Publication No. 2010/0044074
[Patent Document 5] PCT International Publication No. WO2014/021344
[Patent Document 6] Japanese Unexamined Patent Publication No. 2006-190815
[Patent Document 7] Japanese Unexamined Patent Publication No. 2008-103329

Non-Patent Document

[Non-Patent Document 1] ACS Nano, 4 (1), pp. 540 to 546 (2010)
[Non-Patent Document 2] Nano Letters, 2014, 14, pp. 3930 to 3939
[Non-Patent Document 3] Applied Physics Express 2013, 6, 025101

SUMMARY OF THE INVENTION

Problems to be Solved by the Invention

As described above, when the structure of the node between the CNTs is controlled and the electrical joint is improved to allow flowing a sufficient amount of current into the thin film or controlling the amount of current, application to a transparent electrode such as a touch panel or an electrode such as an organic EL and an organic solar cell is available using the flexibility of the CNT. The industrial utility value is extremely high, but none of a thin film has been developed to respond to such requests.

The present invention has been made in consideration of the above-described circumstances, and an object thereof is to improve an electrical joint in a CNTs network thereby to provide a CNTs thin film which has an excellent electrical property and excellent durability.

Solution for Solving Problems

Intensive research conducted by the present inventors to achieve the above-described object has revealed that a network of CNTs or a CNTs hybrid material is constructed by distributing, as a node between CNT and CNT in a CNTs thin film, a fine particle of an inorganic semiconductor, preferably a metal halide, a metal oxide, a metal sulfide or the like. It has been also revealed that the electrical property of the CNT can be adjusted using the electrical characteristics of the inorganic semiconductor to be used.

The present invention has been completed based on these findings. According to the present invention, the following inventions are provided.

[1] A CNT composite film including: a fine particle of an inorganic semiconductor; and CNTs, in which the fine particle of the inorganic semiconductor is present at a node of a plurality of the CNTs.

[2] The CNT composite film according to [1], in which the plurality of CNTs forms a random network.

[3] The CNT composite film according to [1] or [2], in which the inorganic semiconductor is at least one selected from a group consisting of a metal halide and a chalcogenide having a melting point of lower than 1000° C.

[4] The CNT composite film according to [3], in which the metal halide is at least one selected from a group consisting of copper chloride (CuCl), copper bromide (CuBr), copper iodide (CuI), iron chloride ($FeCl_2$), iron bromide ($FeBr_2$), iron iodide ($FeI_2$), magnesium chloride ($MgCl_2$), magnesium bromide ($MgBr_2$), magnesium iodide ($MgI_2$), molybdenum chloride ($MoCl_2$), molybdenum bromide ($MoBr_2$), silver bromide (AgBr), silver iodide (AgI), lead chloride ($PbCl_2$), lead bromide ($PbBr_2$), lead iodide ($PbI_2$), sodium chloride (NaCl), sodium bromide (NaBr), sodium iodide (NaI), lithium, fluoride (LiF), lithium bromide (LiBr), lithium iodide (LiI), potassium bromide (KBr), potassium iodide (KI), lanthanum iodide ($LaI_3$), and bismuth iodide ($BiI_3$), and the chalcogenide is at least one selected from a group consisting of cadmium telluride (CdTe), cadmium selenide (CdSe), zinc telluride (ZnTe), zinc selenide (ZnSe), lead telluride (PbTe), lead selenide (PbSe), tin telluride (SnTe), gallium selenide (GaSe), and bismuth sulfide ($Bi_2S_3$).

[5] The CNT composite film according to any one of [1] to [4], in which an optical transmittance of the CNT composite film is in a range of 50% to 98%.

[6] The CNT composite film according to any one of [1] to [5], in which a thickness of the CNT composite film is in a range of 1 to 1000 nm.

[7] The CNT composite film according to any one of [1] to [6], in which a sheet resistance of the CNT composition film is in a range of 1 to 1000 Ω/square.

[8] A method of producing the CNT composite film according to any one of [1] to [7], including: a first step of forming a laminated film of a CNT-containing thin film and a thin film formed of an inorganic semiconductor or forming a thin film containing a mixture of CNTs and an inorganic semiconductor, on a substrate; and a second step of irradiating the laminated film or the thin film containing the mixture with pulsed light to move the inorganic semiconductor particle to a node of the CNTs.

Effect of Invention

According to the present invention, since a large amount of current flows using an inorganic semiconductor as a node, electrical conduction between CNT and CNT is improved through the fine particle of the inorganic semiconductor and excellent durability can be also obtained.

According to the present invention, since CNT having uniform electrical properties can be obtained by performing chemical modification using an inorganic semiconductor, electrical conduction between CNT and CNT is smoothly carried out.

The energy level of the CNT thin film can be adjusted by performing chemical modification using inorganic semiconductors having different electronic structures and the CNT thin film can be freely changed into an electron acceptor or an electron donor.

BRIEF DESCRIPTION OF THE DRAWINGS

FIG. 7(a) shows the pattern before pulsed light irradiation and FIG. 7(b) shows the pattern after pulsed light irradiation.

DESCRIPTION OF EMBODIMENTS

Figure 1:
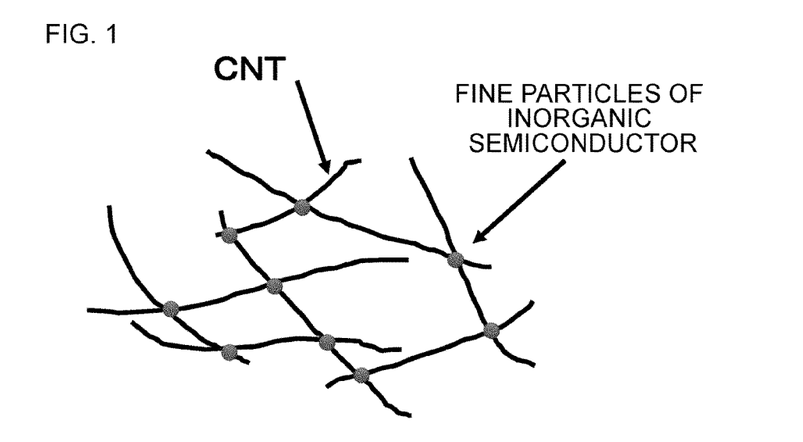
FIG. 1 is a view schematically showing a CNTs network using a metal halide semiconductor as a node in a CNT composite film of the present invention.

A CNT composite film of the present invention includes a fine particle of an inorganic semiconductor; and a CNTs network, in which the fine particle of the inorganic semiconductor is present at a node of a plurality of the CNTs. FIG. 1 is a view schematically showing a CNTs network using the fine particle of the inorganic semiconductor as the node.

Figure 2:
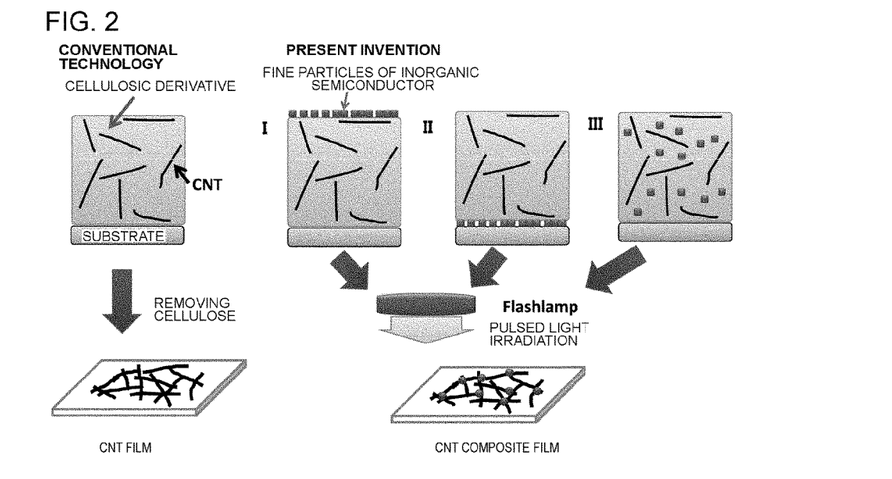
FIG. 2 schematically shows a method of producing the CNT composite film of the present invention.

FIG. 2 schematically shows a method of producing a CNT composite film of the present invention and also simultaneously shows a method of producing a CNT conductive film according to a conventional technology described in Patent Document 5 and Non-Patent Document 3.

As shown in the view on the left end side in FIG. 2, according to the conventional method of producing a CNT conductive film, a film formed of CNT and a non-conductive matrix such as a cellulosic derivative is formed on a substrate, and then a CNT conductive film is obtained by removing the non-conductive matrix from the film.

In contrast, a method of producing the CNT composite film of the present invention includes a first step of forming a laminated film of a CNT-containing thin film and a thin film of an inorganic semiconductor, particularly preferably, copper halide such as CuI, CuBr, CuCl or the like, as shown in I and II of FIG. 2, or forming a thin film containing a mixture of CNTs and an inorganic semiconductor, as shown in III of FIG. 2, on a substrate; and a second step of irradiating the laminated film or the thin film containing the mixture with pulsed light to move the inorganic semiconductor particle to the node of the CNTs. As shown in I and II of FIG. 2, in the laminated film, the order of laminating the CNT-containing thin film and the thin film formed of an inorganic semiconductor is not particularly limited.

A thin film containing a non-conductive matrix is described as the CNT-containing thin film shown in I to III of FIG. 2, but a CNT conductive film from which a non-conductive matrix is removed as shown in the view of the conventional technology may be used.

According to the above-described production method of the present invention, as shown in I to III of FIG. 2, when the thin film of the inorganic semiconductor is formed by vapor deposition or is formed by an application method and then dried to remove the solvent, the inorganic semiconductor is present in the form of the fine particle. When the fine particle of the inorganic semiconductor is irradiated with pulsed light, the fine particle is melted and then moves to the node of a plurality of the CNTs along with the CNT. As the result, a CNTs network using the fine particle of the inorganic semiconductor as the node between CNT and CNT is prepared.

In the present invention, the type of CNT is not particularly limited and conventionally known ones may be used. For example, any of single wall carbon nanotubes, double wall carbon nanotubes, multi-wall carbon nanotubes, rope-like CNT, and ribbon-like CNT may be used. Further, a metal or a semiconductor single CNT which has undergone a step of separating CNT from a metal or a semiconductor may be used.

In a case of using commercially available single wall carbon nanotubes (SWNT), the length or diameter thereof is not particularly limited, but it is preferable that a diameter is 0.4 to 2.0 nm and a length is approximately 0.5 to 5.0 μm, and it has excellent crystallinity and large length.

It is particularly preferable to use SWNT synthesized by a direct injection pyrolytic synthesis (DIPS) method, which is capable obtaining a high-quality product, because a uniform dispersion liquid is obtained.

In the present invention, at least one selected from a group consisting of a metal halide and a chalcogenide having a melting point of lower than 1000° C. is preferably used as the inorganic semiconductor.

Specifically, the metal halide is selected from a group consisting of copper chloride (CuCl), copper bromide (CuBr), copper iodide (CuI), iron chloride ($FeCl_2$), iron bromide ($FeBr_2$), iron iodide ($FeI_2$), magnesium chloride ($MgCl_2$), magnesium bromide ($MgBr_2$), magnesium iodide ($MgI_2$), molybdenum chloride ($MoCl_2$), molybdenum bromide ($MoBr_2$), silver bromide (AgBr), silver iodide (AgI), lead chloride ($PbCl_2$), lead bromide ($PbBr_2$), lead iodide ($PbI_2$), sodium chloride (NaCl), sodium bromide (NaBr), sodium iodide (NaI), lithium fluoride (LiF), lithium bromide (LiBr), lithium iodide (LiI), potassium bromide (KBr), potassium iodide (KI), lanthanum iodide ($LaI_3$), and bismuth iodide ($BiI_3$).

The chalcogenide is selected from a group consisting of cadmium telluride (CdTe), cadmium selenide (CdSe), zinc telluride (ZnTe), zinc selenide (ZnSe), lead telluride (PbTe), lead selenide (PbSe), tin telluride (SnTe), gallium selenide (GaSe), and bismuth sulfide ($Bi_2S_3$).

In the present invention, a base material used for the deposition is not particularly limited, and a transparent base material can be selected as necessary in a case of preparing a transparent conductive film. In addition to glass or quartz glass, a flexible substrate and a transparent and flexible substrate may be used. Specifically, a base material formed of polyethylene naphthalate (PEN), polyimide (PI), polyethylene terephthalate (PET), polyether sulfone (PES), polyethylene (PE), or polycarbonate (PC) may be used, but the base material is not limited to these.

First, a method of preparing a CNT-containing thin film will be described.

In the present invention, the method of preparing a CNT-containing thin film is not particularly limited, but it is preferable that the method described in Patent Document 5 is employed to prepare a uniform thin film.

Hereinafter, the preparation method based on the method described in the document will be described.

A matrix polymer is used for deposition, and a cellulosic derivative having excellent dispersibility is preferably used. Preferred examples thereof include carboxymethyl cellulose, carboxyethyl cellulose, aminoethyl cellulose, oxyethyl cellulose, hydroxymethyl cellulose, hydroxyethyl cellulose hydroxypropyl cellulose, methyl cellulose, ethyl cellulose, benzyl cellulose, and trimethyl cellulose.

In order to preferably produce the CNT-containing thin film of the present invention, first, a solution of the cellulosic derivative is prepared and CNT is added thereto and dispersed therein. Preferred examples of the solvent of the cellulosic derivative include water, ethanol, chloroform, propylene glycol, and a mixed solution of acetone and water. In this case, the concentration of CNT is in a range of 0.005% to 1% by weight and preferably in a range of 0.01% to 0.2% by weight. The concentration of the cellulosic derivative is in a range of 0.1% to 30% by weight and preferably in a range of 2% to 10% by weight.

For dispersion of CNT, dispersion promoting means such as an ultrasonic treatment can be used together. The viscosity of the dispersion liquid is in a range of 0.1 to 1000 cps, and can be suitably selected according to the deposition method. For example, in a case of deposition using a doctor blade, the viscosity thereof is preferably in a range of 6 to 10 cps. In a case of deposition using screen printing, the viscosity thereof is preferably in a range of 10 to 400 cps. The viscosity can be set to be in the above-described range by adjusting the molecular weight or the concentration of a cellulose derivative.

A dispersion liquid obtained in the above-described manner is centrifuged, a supernatant containing fine CNT is collected, and the supernatant may be sued as a CNT dispersion liquid. In the centrifugation in this case, the rotation speed thereof is in a range of 2000 to 60000 rpm and preferably 45000 rpm. The time for centrifugation is approximately 2 hours.

The CNT dispersion liquid prepared in the above-described manner is used for deposition on a substrate according to a doctor blade method or a screen printing method, thereby obtaining a CNT-containing thin film. The deposition method is not limited to the doctor blade method or the screen printing method and various film forming methods such as a cast method, a dip-coating method, and a spin coating method may be used.

Next, a method of removing a non-conductive matrix such as a cellulosic derivative from the CNT-containing thin film will be described.

A first method is a method of removing a non-conductive matrix such as hydroxypropyl cellulose by immersing the CNT-containing thin film in a solvent to recover the conductivity inherent in CNT so as to obtain a conductive thin film.

As the solvent, a poor solvent with respect to a material serving as a matrix is desirable. Examples of the poor solvent include 2-propanol, tert-butyl alcohol, acetone, cyclohexanol, methyl ethyl ketone, methyl acetate, methylene chloride, butyl acetate, butyl cellosolve, and lactic acid.

As the mixed solution, a solution containing xylene and 2-propanol at a mixing ratio of 1:3 can be used. The mixed solution is suitably selected according to the cellulose derivative. For example, in a case where hydroxypropyl cellulose is used as a matrix, it is preferable to use 2-propanol.

A second method is a method of removing a matrix polymer such as hydroxypropyl cellulose from the CNT-containing thin film, obtained by the above-described method, through light annealing to recover the conductivity inherent in CNT so as to obtain a conductive thin film. According to this method, CNT which absorbs light generates heat so that the surrounding matrix is thermally decomposed.

It is necessary that a light source radiate light with an extremely high intensity in an extremely short time. Therefore, it is preferable to use a pulsed laser or a xenon flash lamp.

A third method is a method of exposing a matrix such as hydroxypropyl cellulose in the CNT-containing thin film obtained in the above-described method to oxygen plasma to recover the conductivity inherent in CNT so as to obtain a conductive thin film. According to this method, the surrounding matrix is oxidized and decomposed.

In any of the above-described first to third methods in the present invention, the obtained CNT conductive film can be doped by being immersed in a concentrated nitric acid aqueous solution using a known method.

In the present invention, in a case of depositing a thin film (mixture thin film) containing a mixture of CNT and an inorganic semiconductor, the deposition is performed according to the same method using the CNT dispersion liquid, obtained by the method described above, in which a metal halide or a chalcogenide is dissolved.

Next, a method of preparing a thin film formed of an inorganic semiconductor will be described.

An inorganic semiconductor thin film is formed on a substrate or the CNT-containing thin film prepared on the substrate using the above-described method according to a vacuum deposition method or an application method. The application method is not particularly limited, and examples thereof include a doctor blade method, a spin coating method, an ink-jet method, an aerosol jet printing method, a micro-contact printing method, dip-pen method, and a screen printing method.

In a case where the inorganic semiconductor thin film is formed on the CNT-containing thin film, the inorganic semiconductor thin film may be formed after a non-conductive matrix such as a cellulosic derivative is removed from the CNT-containing thin film according to the above-described method or a non-conductive matrix is removed from the CNT-containing thin film by pulsed light annealing described below.

In other words, the non-conductive matrix is removed and the inorganic semiconductor particle moves to the node of the CNTs at the same time by irradiating the laminated film of a CNT-containing thin film and an inorganic semiconductor thin film with pulsed light.

Similarly, in a case of using the thin film (mixture thin film) containing CNT and an inorganic semiconductor, the non-conductive matrix is removed and the inorganic semiconductor particle moves to the node of the CNTs at the same time by irradiating the mixture thin film with pulsed light.

The pulsed light irradiation is a light annealing (flash lamp annealing) process which is capable of pulse irradiation using a flash lamp or the like as a light source, and has characteristic in that it is capable of conducting light irradiation with an extremely high intensity in an extremely short time of microseconds level. Since the pulsed light irradiation greatly reduces thermal influence on a substrate compared to conventional heat sources, deposition on a plastic film substrate becomes possible.

Since CNT absorbs light from visible light to near infrared light, the lamp is not particularly limited, and examples thereof include a pulsed laser, a xenon lamp, a halogen lamp, and an infrared lamp capable of rapid heating.

In order to prevent thermal influence on an underlayer film or a substrate, the pulsed light irradiation is performed under conditions of an irradiation time of 10 to 1000 μS, an irradiation cycle of 0.1 to 5 Hz, an irradiation intensity at the peak of 5 to 30 kW/cm$^2$, and an irradiation number of 1 to 1000 times.

When a CNT transparent conductive film is prepared using a thin film formed of a network produced in the present invention, the CNT transparent conductive film exhibits, as basic property, a light transmittance of 85% (transmittance of 550 nm when the transmittance of the base material is set to 100%) and a sheet resistance of 60Ω/☐ as shown in examples described below, and world-class performance is achieved in the CNT transparent conductive film. It is found that the durability thereof is also excellent. The method of producing a CNT composite film of the present invention is applicable in a large area of any substrate, with ease and low cost, and is therefore expected as a transparent conductive film material replacing ITO.

In the present invention, when semiconductor type CNT is used as CNT, it is possible to provide a thin film field effect transistor or a PN diode of a CNT thin film.

In other words, extremely thin CNT and an extremely thin semiconductor laminated film are formed using the semiconductor type CNT according to the method of preparing a transparent conductive film of the present invention. In addition, a gate electrode, a source electrode, and a drain electrode are formed, thereby completing a CNT thin film field effect transistor. The ON and OFF functions are realized by controlling the electron state of the inorganic semiconductor which serve as the node between CNT and CNT. It is expected that the charge mobility of CNT is dramatically improved by this physical contact.

Further, an extremely thin CNT film is formed using semiconductor type CNT according to the method of preparing a transparent conductive film of the present invention. An N type inorganic semiconductor and a P type inorganic semiconductor are respectively formed on CNT using a mask or the like according to a vacuum deposition method. A PN diode of a CNT thin film is formed by performing a heat treatment. In addition, a light switch or a device that detects light is completed by adding an electrode.

EXAMPLE

Next, the present invention will be described in more detail with reference to examples. The description below is intended not to limit the present invention but to facilitate understanding of the present invention. In other words, all of modifications, embodiments, and other examples based on the technical scope of the present invention are included in the present invention.

In the following examples, SWNT synthesized by a direct injection pyrolytic synthesis (DIPS) method of National Institute of Advanced Industrial Science and Technology was used.

First, the measurement method and the measuring device used in examples will be described.

<Surface Resistance>

The surface resistivity of a CNT conductive film was measured at room temperature in air using a four probes method resistivity measuring device (Loresta, manufactured by Mitsubishi Chemical Corporation).

<Thickness>

The thickness of the prepared CNT-containing thin film was measured using a stylus type film thickness step and surface shape measuring device (Dektak8, manufactured by ULVAC, Inc.).

The thickness of the vacuum deposited film of the inorganic semiconductor material was measured using a crystal oscillator sensor provided in a vacuum deposition device.

<UV-Visible-Near Infrared Transmission Spectrum>

The UV-visible-near infrared transmission spectrum was measured using an ultraviolet visible near infrared spectrophotometer (V-670, manufactured by JASCO Corporation).

<Atomic Force Micrograph>

An atomic force micrograph was measured using SPA-300 (manufactured by SII Nanotechnology, Inc.) in a Dynamic Force mode.

<X-Ray Thin Film Diffraction>

An X-ray thin film diffraction pattern was measured using Smartlab (manufactured by Rigaku Corporation).

Example 1-A

Two g of hydroxypropyl cellulose (HPC) was dissolved in 40 ml of ethanol, 10 mg of SWNT was added thereto, and the solution was mixed. The mixed solution was dispersed using an ultrasonic treatment and centrifuged at a rotation speed of 45000 rpm. The supernatant after the centrifugation was set to a dispersion liquid.

Deposition was performed with the dispersed solution by moving a blade on a glass substrate at a constant speed using an automatic device according to a doctor blade method. The film was allowed to stand at room temperature for 10 minutes and the solvent was slightly dried, and was then completely dried using a hot plate (100° C.) thereby obtaining a CNT-containing thin film.

Next, the pulsed light annealing was conducted to the CNT-containing thin film obtained in the above-described manner, according to the method described in Patent Document 5 or Non-Patent Document 3, and HPC serving as a matrix was removed therefrom. Here, the pulsed light irradiation was performed under conditions of an irradiation time of 300 μS for each time, an irradiation cycle of 1 Hz, an irradiation intensity of 6 kW/cm$^2$ at the peak, and an irradiation number of 200 times. A CNT conductive film having a transmittance of approximately 80% at 550 nm was obtained. The sheet resistance of the obtained thin film was 500 Ω/☐.

Copper iodide was deposited at a thickness of 10 nm on the above-described CNT conductive film (since the sheet resistance at this time was 10$^6$Ω/☐ or greater, the measurement was not able to be performed), and pulsed light irradiation was conducted by a xenon flash lamp. The pulsed light irradiation was performed under conditions of an irradiation time of 1000 μS for each time, an irradiation cycle of 0.5 Hz, an irradiation intensity of 10 kW/cm$^2$ at the peak, and an irradiation number of 10 times.

The sheet resistance of the obtained CNT composite film was 120Ω/☐. This value indicates that this CNT composite film has conductivity enough to be used as a transparent electrode.

Figure 3:
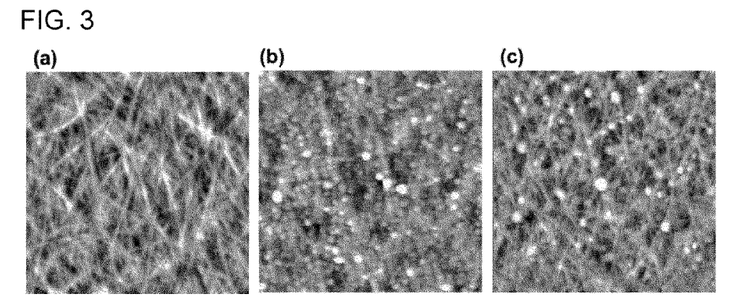
FIG. 3 shows atomic force electron micrographs of a CNT composite film using copper iodide which is obtained in Example 1-A.

FIG. 3 shows atomic force micrographs during deposition. FIG. 3(*a*) shows the CNT conductive film, FIG. 3(*b*) shows the CNT composite film on which copper iodide was deposited, and FIG. 3(*c*) shows the CNT composite film which was annealed with a flash lamp.

As evident from FIG. 3, it was demonstrated that the copper iodide particles uniformly adhering onto the CNT conductive film through vapor deposition moved to the nodes of the CNTs by pulsed light annealing.

Example 1-B

In the present example, an inorganic semiconductor was applied and deposited to a CNT conductive film after a non-conductive matrix was removed therefrom, the light annealing of a flash lamp was conducted, and inorganic semiconductor particles were moved to nodes of CNT.

A CNT conductive film from which HPC was completely removed was obtained by conducting pulsed light annealing on the CNT-containing thin film and washing the film with 2-propanol or water. The CNT conductive film was spin-coated with a solution of 0.05 mol/L of copper iodide in acetonitrile so that copper iodide was laminated on the CNT conductive film, and the CNT conductive film was irradiated with a xenon flash lamp to conduct light annealing. The sheet resistance of the obtained CNT composite film was 80Ω/□ and the transmittance thereof at 550 nm was approximately 80% (relative value when the transmittance of a glass substrate was set to 100%). This value indicates that the CNT composite film has conductivity enough to be used as a transparent electrode.

Example 1-C

In the present example, a transparent conductive film was prepared using copper bromide in place of copper iodide of (Example 1-B).

A CNT conductive film from which HPC was completely removed was obtained by conducting pulsed light annealing on the CNT-containing thin film and washing the film with 2-propanol or water. The CNT conductive film was spin-coated with a solution of 0.05 mol/L of copper bromide in acetonitrile so that copper bromide was laminated on the CNT conductive film, and the CNT conductive film was irradiated with a xenon flash lamp to conduct light annealing. The sheet resistance of the obtained CNT composite film was 80Ω/□ and the transmittance thereof at 550 nm was approximately 80% (relative value when the transmittance of a glass substrate was set to 100%). This value indicates that the CNT composite film has conductivity enough to be used as a transparent electrode.

Example 2

In the present example, removal of HPC and movement of copper halide particles to nodes were carried out at the same time by conducting light annealing of a flash lamp.

After copper iodide was deposited at an average thickness of 10 nm on the CNT-containing thin film having a transmittance of approximately 85%, the film was irradiated with a xenon flash lamp to conduct light annealing. The pulsed light irradiation was performed under conditions of an irradiation time of 500 µS for each time, an irradiation cycle of 1 Hz, an irradiation intensity of 10 kW/cm$^2$ at the peak, and an irradiation number of 20 times.

The sheet resistance of the obtained CNT composite film was 65Ω/□. This value indicates that the CNT composite film has conductivity enough to be used as a transparent electrode.

Figure 4:
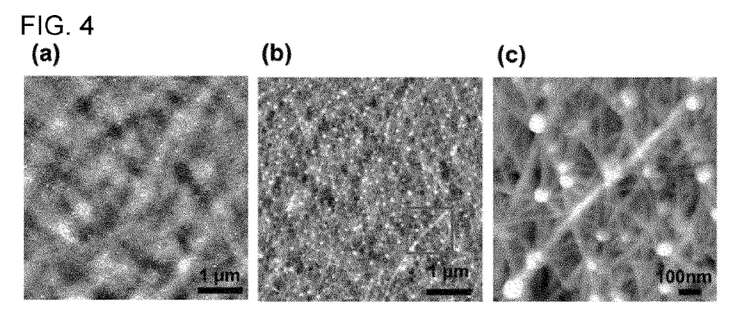
FIG. 4 shows atomic force electron micrographs of a CNT composite film using copper iodide which is obtained in Example 2.

FIG. 4 shows atomic force micrographs during deposition. FIG. 4(*a*) shows the CNT-containing thin on which copper iodide was deposited, FIG. 4(*b*) shows the CNT composite film which was annealed with a xenon flash lamp, and FIG. 4(*c*) is a micrograph partially enlarging the CNT composite film of FIG. 4(*b*). As evident from FIG. 4, it was demonstrated that the size of the copper iodide particles uniformly adhering onto the CNT-containing thin film through vapor deposition was increased and the particles moved to the nodes of the CNTs by light annealing. At the same time, in the CNT composite film annealed with light, each fiber of CNT was clearly observed and it was demonstrated that moving the copper iodide to the node and removing the HPC serving as an insulating matrix polymer were able to be conducted at the same time by light annealing.

Example 3

In the present example, a transparent conductive film was prepared using copper bromide in place of copper iodide of Example 2.

In other words, after copper bromide was deposited at an average thickness of 10 nm on the CNT-containing thin film having a transmittance of approximately 85%, the film was irradiated with a xenon flash lamp to conduct light annealing. The pulsed light irradiation was performed under conditions of an irradiation time of 500 µS for each time, an irradiation cycle of 1 Hz, an irradiation intensity of 10 kW/cm$^2$ at the peak, and an irradiation number of 20 times. The sheet resistance of the obtained CNT composite film was 60 Ω/□.

Figure 5:
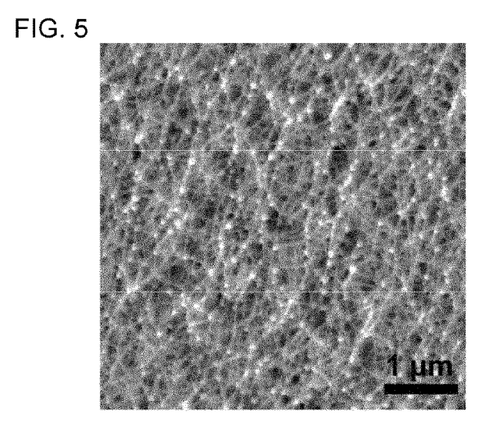
FIG. 5 is an atomic force electron micrograph of a CNT composite film using copper bromide which is obtained in Example 3.

FIG. 5 shows an atomic force micrograph of the obtained CNT composite film. As evident from FIG. 5, it was demonstrated that copper bromide particles uniformly adhering onto the CNT thin film through vapor deposition moved to the nodes of the CNTs.

Example 4

In the present example, a transparent conductive film was prepared using copper chloride in place of copper iodide of Example 2.

In other words, after copper chloride was deposited at an average thickness of 10 nm on the CNT-containing thin film having a transmittance of approximately 85%, the film was irradiated with a xenon flash lamp to conduct light annealing. The pulsed light irradiation was performed under conditions of an irradiation time of 500 µS for each time, an irradiation cycle of 1 Hz, an irradiation intensity of 10 kW/cm$^2$ at the peak, and an irradiation number of 20 times. The sheet resistance of the obtained CNT composite film was 60 Ω/□.

Figure 6:
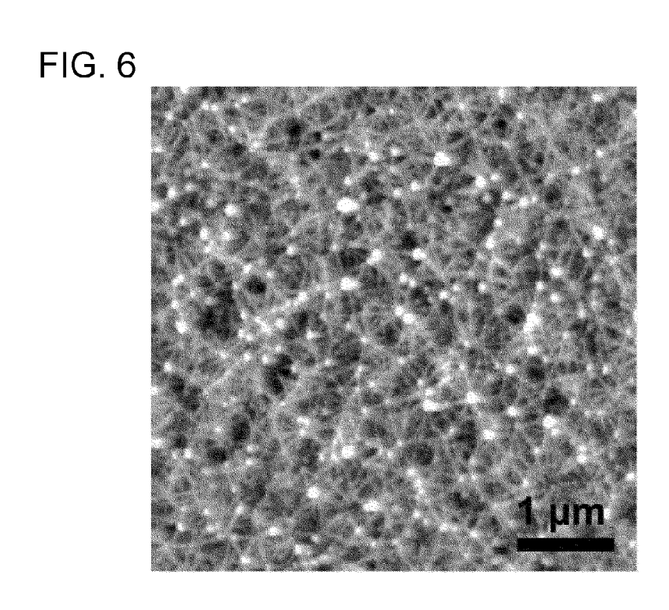
FIG. 6 is an atomic force electron micrograph of a CNT composite film using copper chloride which is obtained in Example 4.

FIG. 6 shows an atomic force micrograph of the obtained CNT composite film. As evident from FIG. 6, it was demonstrated that the copper chloride particles uniformly adhering onto the CNT thin film through vapor deposition moved to the nodes of the CNTs.

Example 5

In the present example, measurement of X-ray thin film diffraction was performed on a copper halide-containing CNT composite film.

Figure 7:
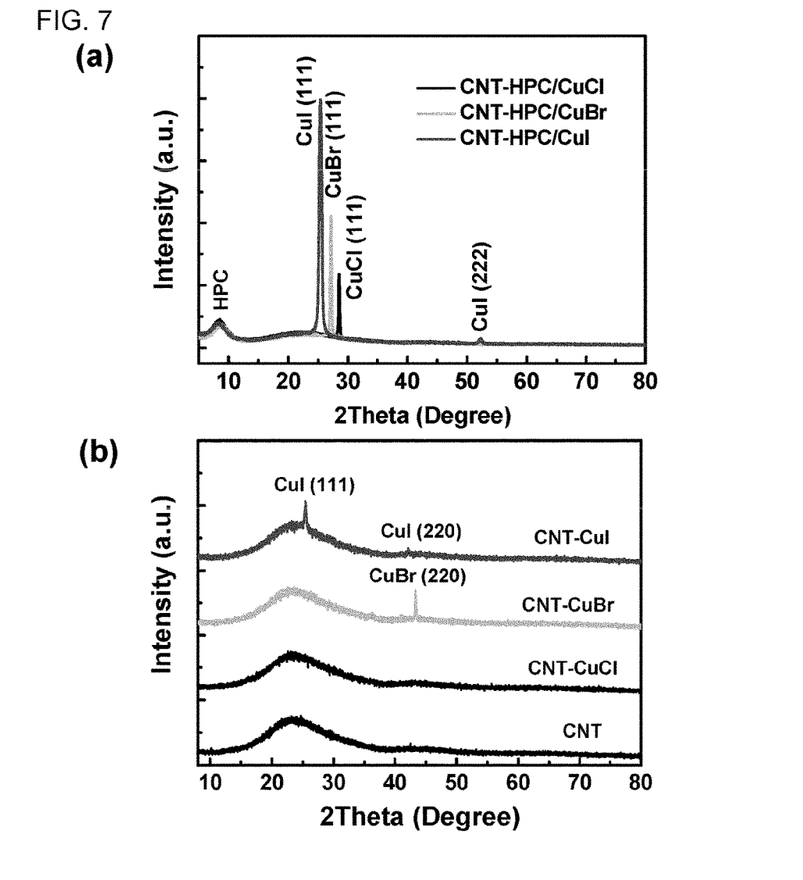
FIG. 7 shows X-ray diffraction patterns of copper halide and a CNT composite film.

A copper halide-containing CNT composite film was prepared in the same manner as in Examples 2, 3, and 4. FIG. 7 shows results of X-ray diffraction of the obtained thin film.

As evident from FIG. 7, although a decrease in diffraction intensity resulting from pulsed light irradiation was shown, a diffraction peak derived from copper iodide was clearly observed. For this reason, it was demonstrated that metal halide of a raw material remained in the film without being decomposed.

Example 6

In the present example, removal of HPC and movement of copper halide particles to nodes were carried out at the same time by applying a CNT-containing thin film to a substrate on which copper halide was vacuum-deposited, and performing light annealing of a flash lamp.

Copper iodide, copper bromide, or copper chloride was vacuum-deposited on a glass substrate at a film thickness of approximately 10 nm.

A CNT-containing thin film having a transmittance of approximately 85% was prepared on each of these thin films. Further, the light annealing was conducted to these laminated thin films using a xenon flash lamp.

The pulsed light irradiation was performed under conditions of an irradiation time of 500 μS for each time, an irradiation cycle of 1 Hz, an irradiation intensity of 10 kW/cm$^2$ at the peak, and an irradiation number of 20 times.

The sheet resistance of the obtained CNT composite film was in a range of 90Ω/□ to 150Ω/□. This value indicates that the CNT composite film has conductivity enough to be used as a transparent electrode.

Figure 8:
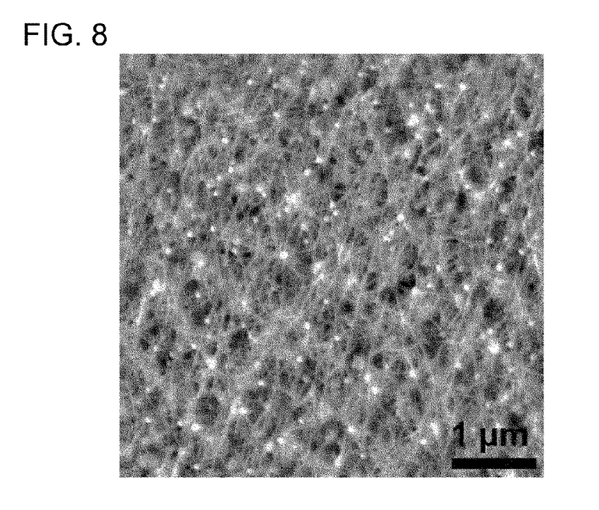
FIG. 8 is an atomic force electron micrograph of a CNT composite film using copper chloride which is obtained in Example 6.

FIG. 8 shows an atomic force micrograph of the obtained copper chloride-containing CNT composite film. As evident from FIG. 8, it was demonstrated that the copper halide which was uniformly deposited under the CNT thin film moved to the inside of the CNT thin film by light annealing, appeared on the surface of the CNT thin film, and moved to the nodes of the CNTs. At the same time, in the CNT composite film annealed with light, each fiber of CNT was clearly observed and it was demonstrated that moving the copper iodide to the node and removing the HPC serving as an insulating matrix polymer were able to be conducted at the same time by light annealing.

Example 7

In the present example, a change in sheet resistance of a CNT composite film, provided with nodes using copper halide particles, over time was examined.

A copper iodide-containing CNT composite film was prepared using the same method. Further, a CNT conductive film was prepared using the same. The CNT conductive film obtained in the same method was immersed in a nitric acid solution for 30 minutes to conduct doping according to the method described in Patent Document 5, extra nitric acid was removed from the film using water, and the film was dried using a hot plate at 50° C., thereby preparing a CNT conductive film. The transmittance of each thin film at 550 nm was approximately 83%.

Figure 9:
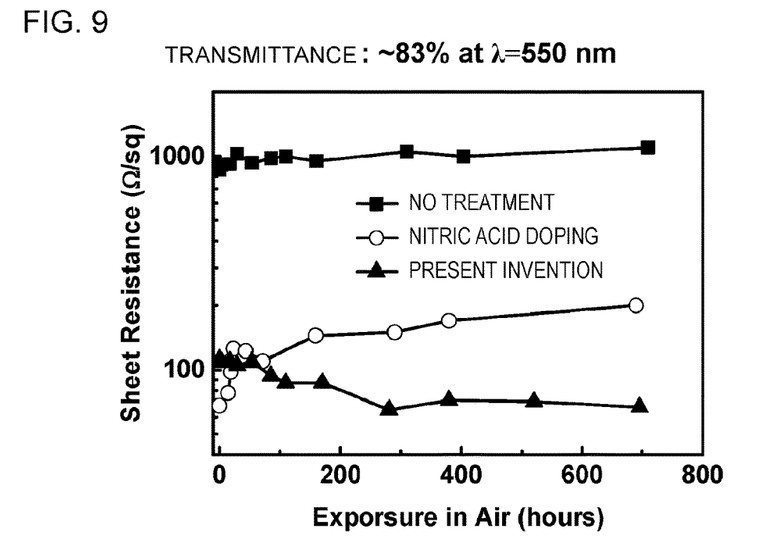
FIG. 9 is a diagram showing a change in sheet resistance of a CNT thin film over time.

FIG. 9 shows a change in sheet resistance of each thin film over time when these thin films were allowed to stand at room temperature in air. As evident from FIG. 9, in the CNT conductive film doped with nitric acid, the sheet resistance of the CNT conductive film at the time of being initially prepared was small, but the sheet resistance thereof measured immediately after the preparation was increased two times the initial sheet resistance. Thereafter, the sheet resistance thereof became gradually increased. Meanwhile, in the copper iodide-containing CNT composite film, the sheet resistance thereof was not greatly changed even when the time elapsed after the preparation. Therefore, it was demonstrated that the copper iodide-containing CNT composite film is an extremely stable transparent conductive film.

Example 8

In the present example, the relationship between the transmittance and the sheet resistance of a CNT composite film provided with nodes using copper halide particles was examined.

CNT-containing thin films having different film thicknesses were prepared using the same method, and then copper halide-containing CNT composite films were prepared using the same method as in Examples 2, 3, and 4. Further, a CNT-containing thin film having a different film thickness was prepared using the same method, and then a CNT conductive film was prepared by a light annealing treatment and a solution treatment using the same methods. The transmittance of the obtained copper halide-containing CNT composite film and the transmittance of the obtained CNT conductive film at 550 nm were in a range of 67% to 96%.

Figure 10:
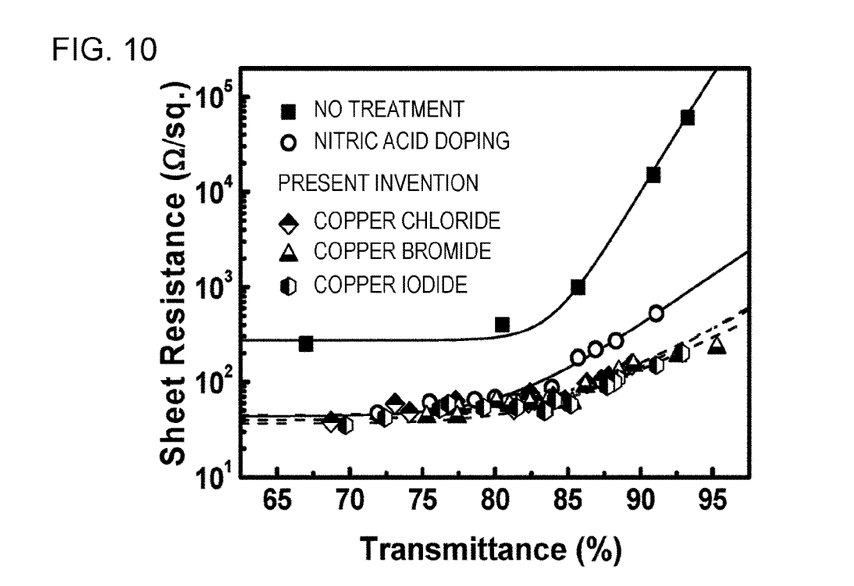
FIG. 10 is a diagram showing a relationship between the transmittance and the sheet resistance of a CNT thin film.

FIG. 10 shows a relationship between the transmittance and the sheet resistance of each thin film. As evident from FIG. 10, in a CNT thin film which did not contain copper halide, when the transmittance was increased, in other words, the film thickness was decreased, the sheet resistance was drastically increased. The reason for this was considered that electrical conduction was not sufficiently made when a network of CNT became sparse because of insufficient connection between CNTs adjacent to each other in a thin film. Meanwhile, in a CNT thin film which contained copper iodide, copper bromide, or copper chloride, when the transmittance was increased, in other words, the film thickness was decreased, the sheet resistance was only gently increased. Compared to the doping technology using a concentrated nitric acid aqueous solution, the CNT composite film having a transmittance of around 90% which was obtained by the present technology had a low sheet resistance of one-half to one-third the sheet resistance of the thin film doped using a concentrated nitric acid aqueous solution. From this, it was demonstrated that electrical conduction was sufficiently held even when a network of CNT became sparse because copper halide was present at the node of the CNTs and the connection between CNTs was strengthened.

Example 9

In the present example, a method of preparing a CNT composite film by mixing an inorganic compound into a CNT-containing ink in advance for deposition and performing a post-treatment so that inorganic semiconductor particles move to nodes is described.

Two g of hydroxypropyl cellulose (HPC) was dissolved in 38 ml of water, 10 mg of SWNT was added thereto, and the solution was mixed. The mixed solution was dispersed using an ultrasonic treatment and centrifuged at a rotation speed of 45000 rpm. The supernatant after the centrifugation was set to a dispersion liquid, and iron chloride (II) (FeCl$_2$) was dissolved in the dispersion liquid.

Deposition was performed with the dispersed solution by moving a blade on a glass substrate at a constant speed using an automatic device according to a doctor blade method. The film was allowed to stand at room temperature for 10 minutes and the solvent was slightly dried, and was then completely dried using a hot plate (100° C.) thereby obtaining a mixture thin film.

Next, the light annealing was conducted, using a xenon flash lamp, to the mixture thin film obtained in the above-described manner, and then HPC serving as a matrix was removed from the mixture thin film. Simultaneously, iron chloride (II) particles moved to nodes of CNT, and then a conductive or semiconductor thin film in which CNTs were brought into excellent electrical contact with each other was able to be obtained.

Example 10

In the present example, a method of preparing a CNT thin film by depositing metal halide on a CNT thin film while heating the thin film so that inorganic semiconductor particles move to nodes is described.

A CNT thin film prepared using an optional method, for example, using the above-described method was fixed to a vacuum deposition device including a substrate heating mechanism, a metal halide was vacuum-deposited at a thickness of approximately 1 nm while the temperature of the substrate was maintained to 400° C. The molecules of copper halide moved along CNT by heating the thin film and concentrated in nodes of CNT to obtain particles, and then a conductive or semiconductor thin film in which CNTs were brought into excellent electrical contact with each other was able to be obtained.

INDUSTRIAL APPLICABILITY

The CNT composite film of the present invention can be used in the field of various transparent electronic devices such as solar cells, ELs, and touch panels in place of ITO because a transparent conductive film which has a large area and is inexpensive can be mass-produced using carbon materials saving resources and an inexpensive deposition technology (including printing).

In regard to CNT, the cost is lower than that of an organic semiconductor, a technique of preparing a thin film in a large area can be performed, and the heat resistance and chemical stability are also excellent, a thin film field effect transistor using the CNT composite film of the present invention is expected to be applied to an organic EL and a flexible electronic device.

Further, an optical switch using the CNT composite film of the present invention is expected to be applied to an energy-saving electronic device or an optical communication device. Furthermore, a PN diode using the CNT composite film of the present invention can be used for an element that detects special light (light in a THz region) due to the characteristics of CNT.

The invention claimed is:
1. A carbon nanotube composite film comprising:
a particle of an inorganic semiconductor; and
a carbon nanotubes network,
wherein the particle of the inorganic semiconductor serves as a node between a plurality of the carbon nanotubes,
wherein the inorganic semiconductor is a metal halide having a melting point of lower than 1000° C.,
wherein the metal halide is at least one selected from a group consisting of copper chloride (CuCl), copper bromide (CuBr), copper iodide (Cue and iron chloride ($FeCl_2$),
wherein an optical transmittance of the carbon composite film is in a range of 50% to 98%,
wherein a thickness of the carbon nanotube composite film is in a range of 1 to 1000 nm, and
wherein a sheet resistance of the carbon nanotube composite film is in a range of 1 to 1000 Ω/square.
2. The carbon nanotube composite film according to claim 1, wherein the plurality of carbon nanotubes forms a random network.

* * * * *